US008350611B1

(12) United States Patent
Hsu

(10) Patent No.: US 8,350,611 B1
(45) Date of Patent: Jan. 8, 2013

(54) BANDGAP CIRCUIT AND START CIRCUIT THEREOF

(75) Inventor: Chuan-Chien Hsu, Tainan (TW)

(73) Assignee: Himax Technologies Limited, Tainan (TW)

( * ) Notice: Subject to any disclaimer, the term of this patent is extended or adjusted under 35 U.S.C. 154(b) by 51 days.

(21) Appl. No.: 13/161,281

(22) Filed: Jun. 15, 2011

(51) Int. Cl.
*H03K 17/22* (2006.01)
*H03K 17/687* (2006.01)
*G05F 3/26* (2006.01)
*G05F 3/30* (2006.01)

(52) U.S. Cl. ........ 327/198; 327/539; 327/541; 323/901; 323/313; 323/315

(58) Field of Classification Search ........................ None
See application file for complete search history.

(56) References Cited

U.S. PATENT DOCUMENTS 5,949,227 A * 9/1999 Bujanos ........................ 323/313
2010/0225384 A1* 9/2010 Hirose et al. .................. 327/543
2012/0212207 A1* 8/2012 Chen ............................ 323/313

* cited by examiner

*Primary Examiner* — Lincoln Donovan
*Assistant Examiner* — Terry L Englund
(74) *Attorney, Agent, or Firm* — J.C. Patents

(57) ABSTRACT

A start circuit including a load unit, a first switch, a second switch and a reset control circuit is provided. The load unit receives a power voltage. The first switch is electrically connected between a first end of the load unit and a ground, and receives a node voltage from a reference circuit. The second switch has a first end electrically connected to the reference circuit, a second end electrically connected to the ground, and a control end electrically connected to the second end of the load unit. The second switch determines whether to provide a start voltage to the reference circuit according to a conducting state thereof. The reset control circuit provides a discharge path between a control end of the first switch and the ground, and conducts the discharge path according to the power voltage during a period when the power voltage is smaller than a threshold voltage.

15 Claims, 3 Drawing Sheets

BANDGAP CIRCUIT AND START CIRCUIT THEREOF

BACKGROUND

1. Field of the Invention

The invention relates to a bandgap circuit and a start circuit thereof. Particularly, the invention relates to a bandgap circuit having a start function and a start circuit thereof.

2. Description of Related Art

FIG. 1 is a circuit diagram of a conventional bandgap circuit. As shown in FIG. 1, the bandgap circuit 100 includes a start circuit 110 and a reference current generating circuit 120. The reference current generating circuit 120 includes a plurality of current mirrors 121-124, and the current mirrors 121-124 are connected in cascade with each other and have bias nodes $N_{11}$-$N_{14}$. Moreover, the current mirrors 121-124 are electrically connected to ground through bipolar transistors BT11-BT12 and a resistor R1. In this way, the reference current generating circuit 120 can map a reference current $IR_1$ proportional to absolute temperature (PTAT) through P-channel transistors MT11 and MT12.

In order to ensure the reference current generating circuit 120 to normally provide the reference current $IR_1$, the start circuit 110 is used to break the reference current generating circuit 120 away from a zero-current state. In operation, a control end of a switch SW11 receives a node voltage $VN_1$ from the bias node $N_{14}$, and a switch SW12 determines whether or not to provide a start voltage $VT_1$ to the bias node $N_{12}$ according to its conducting state. Where, during an initial stage that a power voltage $VD_1$ is gradually increased from a ground voltage, the node voltage $VN_1$ is close to the ground voltage, so that the switch SW11 cannot be turned on.

Now, the switch SW12 receives the power voltage $VD_1$ through a load unit 111, and conducts two ends thereof to provide the start voltage $VT_1$ to the bias node $N_{12}$. In this way, the reference current generating circuit 120 can leave the zero-current state according to the start voltage $VT_1$. Then, the node voltage $VN_1$ is gradually increased as the power voltage $VD_1$ is increased, so as to turn on the switch SW11. Now, the switch SW12 receives the ground voltage and cannot conduct the two ends thereof. In this way, the start circuit 110 stops outputting the start voltage $VT_1$, and the reference voltage generating circuit 120 can normally supply the reference current $IR_1$.

However, when the power-on/off time of the system is excessively short, i.e. the power voltage $VD_1$ is quickly switched, residual charges are accumulated at the bias nodes $N_{11}$-$N_{14}$ in a large amount. In this way, during an initial stage of powering on the system, the switch SW11 cannot be normally turned off, and accordingly the switch SW12 cannot be normally turned on. In other words, when the power voltage $VD_1$ is quickly switched, the start circuit 110 cannot normally operate, which may lead to a result that the reference current generating circuit 120 cannot leave the zero-current state.

SUMMARY OF THE INVENTION

The invention is directed to a start circuit, in which a reset control circuit is used to provide a discharge path to conduct residual charges accumulated at a bias node to the ground. In this way, although a power voltage is quickly switched, the start circuit can still normally provide a start voltage.

The invention is directed to a bandgap circuit having a start circuit. The start circuit is capable of normally providing a start voltage in case that a power voltage is quickly switched. In this way, the bandgap circuit driven by the start circuit can normally operate.

The invention provides a start circuit, which uses a start voltage to start a reference circuit, where the reference circuit includes a first bias node and a second bias node. The start circuit includes a load unit, a first switch, a second switch and a reset control circuit. A first end of the load unit receives a power voltage. A first end of the first switch is electrically connected to a second end of the load unit, a second end of the first switch is electrically connected to ground, and a control end of the first switch receives a node voltage from the first bias node. Moreover, a first end of the second switch is electrically connected to the second bias node, a second end of the second switch is electrically connected to the ground, and a control end of the second switch is electrically connected to the second end of the load unit. In operation, the second switch determines whether or not to provide the start voltage to the second bias node according to a conducting state thereof. Moreover, the reset control circuit provides a discharge path between the control end of the first switch and the ground, and conducts the discharge path according to the power voltage during a period when the power voltage is smaller than a threshold voltage.

In an embodiment of the invention, the reset control circuit includes a third switch and a controller. The third switch provides the discharge path. Moreover, a first end of the third switch is electrically connected to the control end of the first switch, and a second end of the third switch is electrically connected to the ground. The controller is electrically connected to a control end of the third switch. During the period when the power voltage is smaller than the threshold voltage, the controller increases a level of a reset voltage according to the power voltage to turn on the third switch. Moreover, when the power voltage is greater than the threshold voltage, the controller switches the reset voltage to a ground voltage to turn off the third switch.

The invention provides a bandgap circuit including a reference circuit and a start circuit. The reference circuit includes a first bias node and a second bias node. The start circuit uses a start voltage to start the reference circuit, and includes a load unit, a first switch, a second switch and a reset control circuit. A first end of the load unit receives a power voltage. The first switch is electrically connected between a second end of the load unit and ground, and a control end of the first switch receives a node voltage from the first bias node. Moreover, a first end of the second switch is electrically connected to the second bias node, a second end of the second switch is electrically connected to the ground, and a control end of the second switch is electrically connected to the second end of the load unit. In operation, the second switch determines whether or not to provide the start voltage to the second bias node according to a conducting state thereof. Moreover, the reset control circuit provides a discharge path between the control end of the first switch and the ground, and conducts the discharge path according to the power voltage during a period when the power voltage is smaller than a threshold voltage.

According to the above descriptions, in the invention, the reset control circuit is used to provide the discharge circuit, and the reset control circuit conducts the discharge path during the period when the power voltage is smaller than the threshold voltage. In this way, during an initial phase of booting the system, the residual charges accumulated at the bias node can be conducted to the ground through the discharge path. Therefore, although the power voltage is quickly switched, the start circuit can still normally provide the start voltage to the reference circuit, so that the reference circuit can normally operate.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
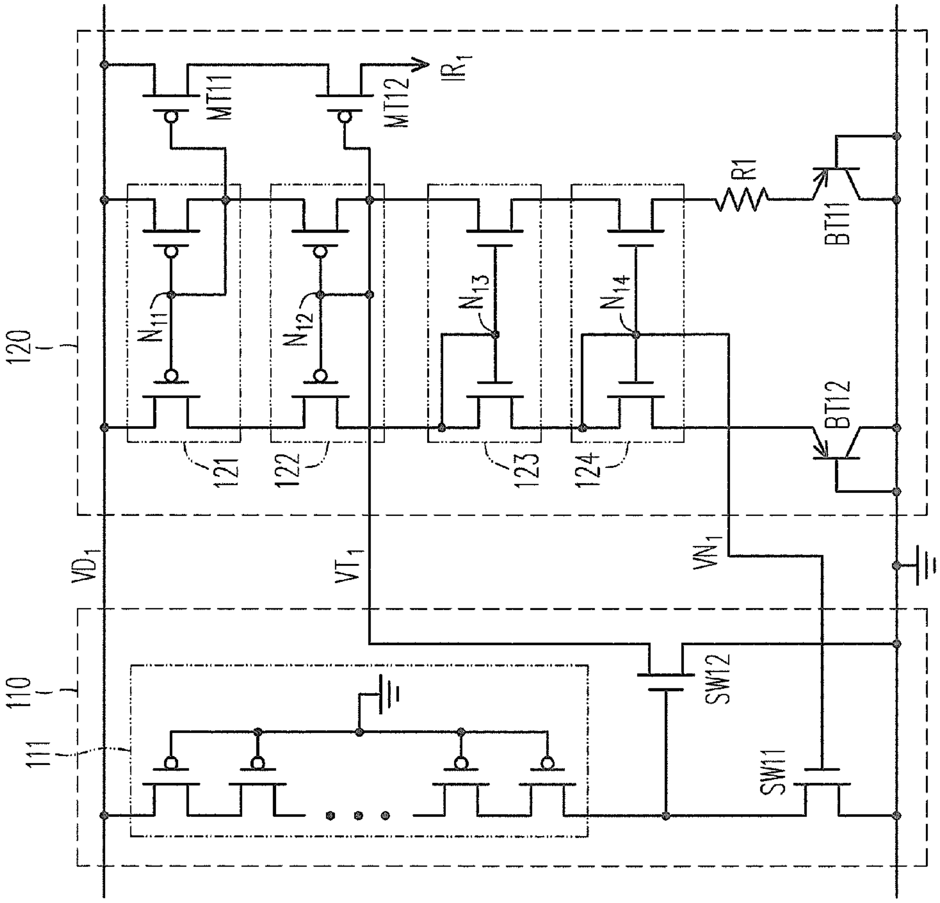
FIG. 1 (RELATED ART)
FIG. 1 is a circuit diagram of a conventional bandgap circuit.
Figure 2:
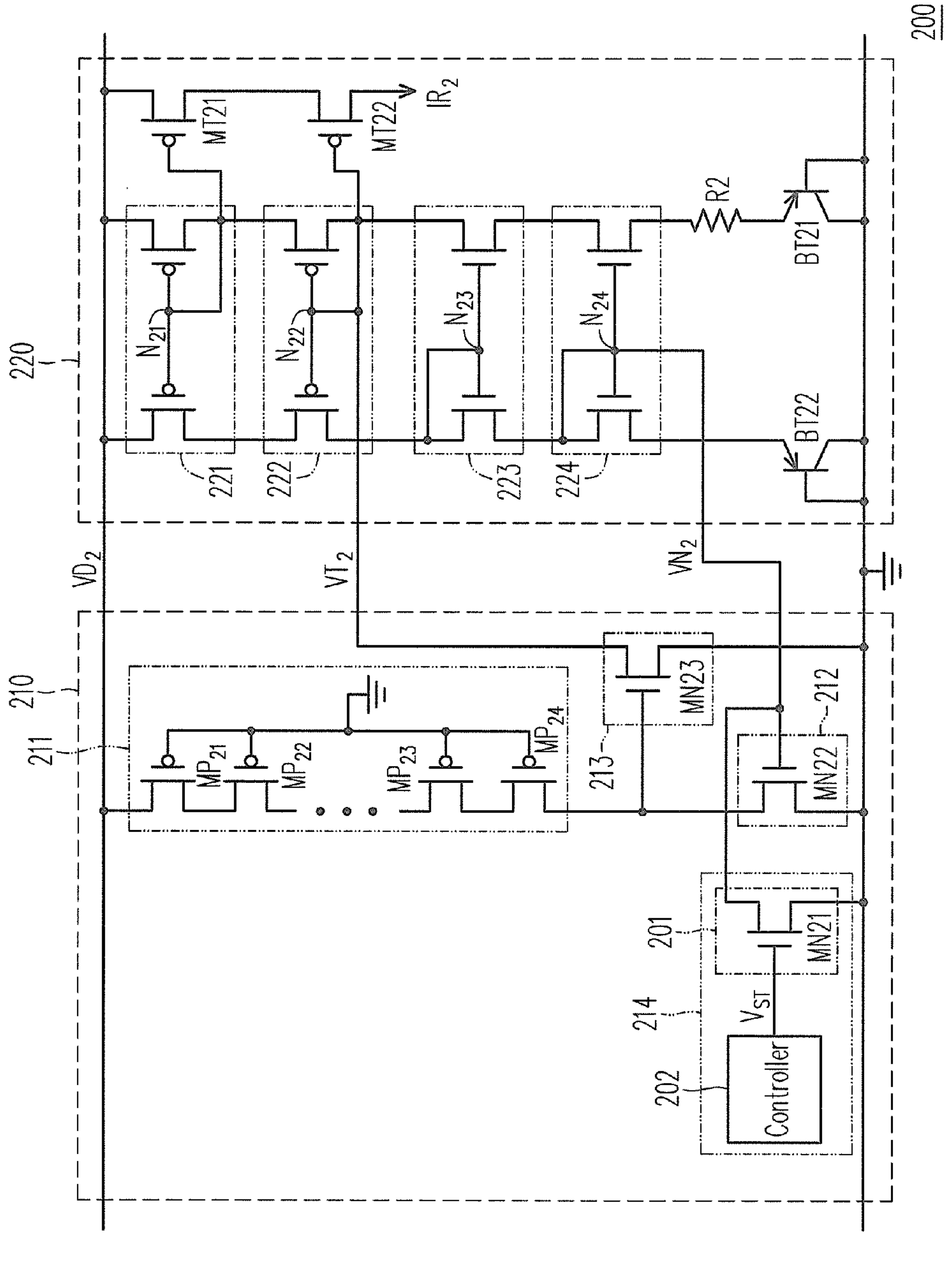
FIG. 2 is a circuit diagram of a bandgap circuit according to an embodiment of the invention.

FIG. 2 is a circuit diagram of a bandgap circuit according to an embodiment of the invention. Referring to FIG. 2, the bandgap circuit 200 includes a start circuit 210 and a reference circuit 220. The reference circuit 220 is, for example, a reference current generating circuit or a reference voltage generating circuit. In the present embodiment, the reference current generating circuit is taken as an example for description, so that the reference circuit 220 includes current mirrors 221-224, a resistor R2, bipolar transistors BT21 and BT22, and P-channel transistors MT21 and MT22.

The current mirrors 221-224 are electrically connected in cascaded, and have bias nodes $N_{21}$-$N_{24}$. Moreover, the current mirror 221 is used for receiving a power voltage $VD_2$. One end of the current mirror 224 is electrically connected to a ground through the resistor R2 and the bipolar transistor BT21, and another end of the current mirror 224 is electrically connected to the ground through the bipolar transistor BT22. In this way, the reference current generating circuit 220 can map a reference current $IR_2$ proportional to absolute temperature (PTAT) through the P-channel transistors MT21 and MT22.

Referring to FIG. 2, the start circuit 210 includes a load unit 211, a switch 212, a switch 213 and a reset control circuit 214. A first end of the load unit 211 receives the power voltage $VD_2$. A first end of the switch 212 is electrically connected to a second end of the load unit 211, a second end of the switch 212 is electrically connected to the ground, and a control end of the switch 212 receives a node voltage $VN_2$ from the bias node $N_{24}$. Moreover, a first end of the switch 213 is electrically connected to the bias node $N_{22}$, a second end of the switch 213 is electrically connected to the ground, and a control end of the switch 213 is electrically connected to the second end of the load unit 211. Moreover, the reset control circuit 214 is electrically connected to the control end of the switch 212.

In operation, in order to avoid accumulation of a large amount of residual charges on the bias node $N_{24}$ due to quick switch of the power voltage $VD_2$, the reset control circuit 214 provides a discharge path between the control end of the switch 212 and the ground. Moreover, during a period when the power voltage $VD_2$ is smaller than a threshold voltage, the reset control circuit 214 conducts the discharge path according to the power voltage $VD_2$. In this way, although the power voltage $VD_2$ is quickly switched, the residual charges accumulated at the bias node $N_{24}$ can be discharged to the ground through the discharge path provided by the reset control circuit 214.

In other words, during an initial stage of booting the system, i.e. during an initial stage when the power voltage $VD_2$ is gradually increased from the ground voltage, the node voltage $VN_2$ of the bias node $N_{24}$ approaches to the ground voltage through the discharge path provided by the reset control circuit 214. In this way, during the initial state of booting the system, the switch 212 is maintained to a turn-off state. Accordingly, since the switch 212 is turned off, the switch 213 can receive the power voltage $VD_2$ through the load unit 211 to conduct two ends thereof. At this moment, the level in the first end of the switch 213 is switched to the ground voltage. In other words, the switch 213 provides a start voltage $VT_2$ (e.g. the ground voltage) to the bias node $N_{22}$ through the first end thereof. In this way, the reference current generating circuit 220 can escape from a zero-current state according to the start voltage $VT_2$.

In addition, as the power voltage $VD_2$ is gradually increased to exceed the threshold voltage, the reset control circuit 214 disconnects the discharge path. Now, the node voltage $VN_2$ is gradually increased as the power voltage $VD_2$ is increased, so as to turn on the switch 212. As the switch 212 is turned on, the switch 213 receives the ground voltage and cannot conduct the two ends thereof. As the switch 213 is turned off, the switch 213 cannot provide the start voltage $VT_2$ to the bias node $N_{22}$. Therefore, the reference current generating circuit 220 can normally provide the reference current $IR_2$.

Figure 3:
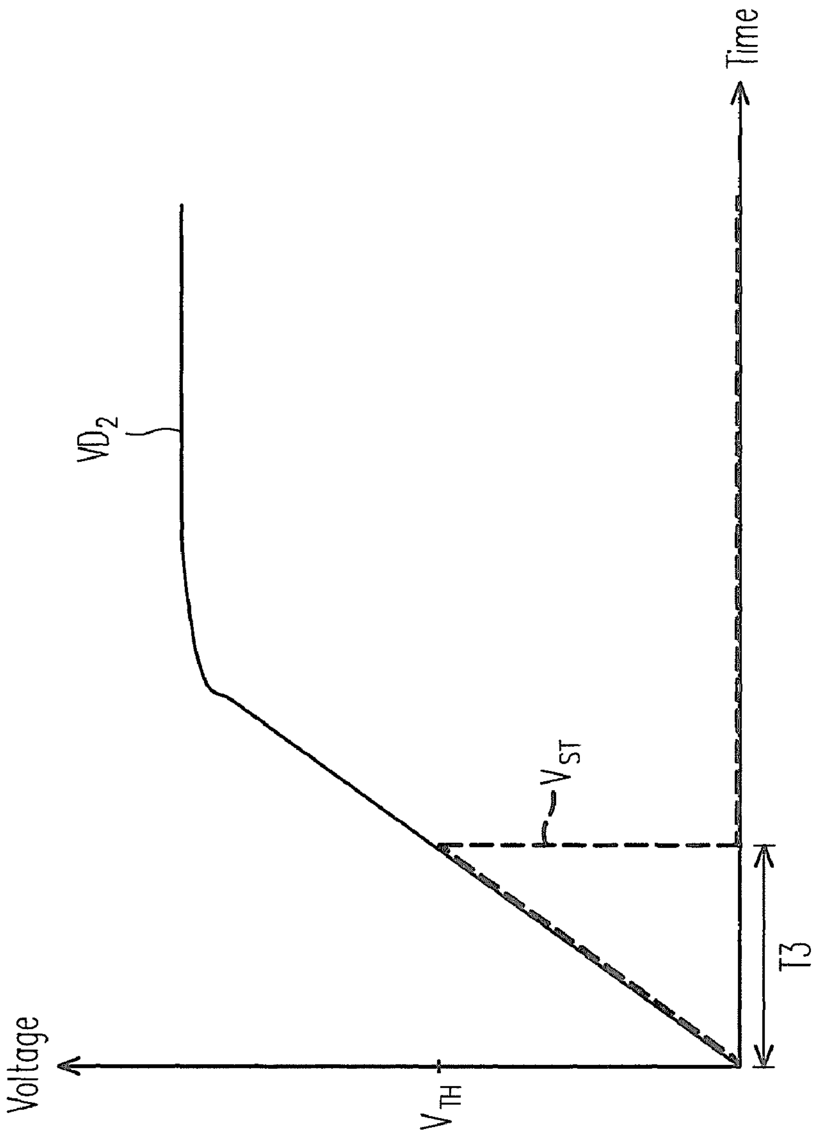
FIG. 3 is a voltage timing diagram according to an embodiment of the invention.

Further, the reset control circuit 214 includes a switch 201 and a controller 202. A first end of the switch 201 is electrically connected to the control end of the switch 212, and a second end of the switch 201 is electrically connected to the ground. The controller 202 is electrically connected to a control end of the switch 201. Moreover, FIG. 3 is a voltage timing diagram according to an embodiment of the invention. Detailed operations of the reset control circuit 214 are described with reference of FIG. 2 and FIG. 3.

In operation, the switch 201 is used to provide the discharge path, and the controller 202 controls a conducting state of the discharge path. During the period when the power voltage $VD_2$ is smaller than the threshold voltage $V_{TH}$, the controller 202 increases a level of a reset voltage $V_{ST}$ according to the power voltage $VD_2$. For example, as shown in FIG. 3, during a period T3, the controller 202 gradually increases the level of the reset voltage $V_{ST}$ according to the power voltage $VD_2$. In this way, the switch 201 conducts two ends thereof according to the reset voltage $V_{ST}$ to form the discharge path. On the other hand, when the power voltage $VD_2$ is greater than the threshold voltage $V_{TH}$, the controller 202 switches the reset voltage $V_{ST}$ to the ground voltage. In this way, the switch 201 cannot conduct the two ends thereof, so that the discharge path is disconnected.

Moreover, in the present embodiment, the switch 201, the switch 212 and the switch 213 are respectively composed of an N-channel transistor. For example, the switch 201 is composed of an N-channel transistor MN21, where a drain of the N-channel transistor MN21 is electrically connected to the control end of the switch 212, a source of the N-channel transistor MN21 is electrically connected to the ground, and a gate of the N-channel transistor MN21 is electrically connected to the controller 202. Moreover, the switch 212 is composed of an N-channel transistor MN22, where a drain of the N-channel transistor MN22 is electrically connected to the second end of the load unit 211, a source of the N-channel transistor MN22 is electrically connected to the ground, and a gate of the N-channel transistor MN22 is electrically connected to the bias node $N_{24}$.

Moreover, the switch 213 is composed of the N-channel transistor MN23, where a drain of the N-channel transistor MN23 is electrically connected to the bias node $N_{22}$, a source of the N-channel transistor MN23 is electrically connected to the ground, and a gate of the N-channel transistor MN23 is electrically connected to the second end of the load unit 211. Moreover, in the present embodiment, the load unit 211 includes a plurality of P-channel transistors MP21-MP24. Gates of the P-channel transistors MP21-MP24 are electrically connected to the ground, and the P-channel transistors MP21-MP24 are connected in series between the power voltage $VD_2$ and the first end of the switch 212.

In summary, in the invention, the reset control circuit is used to provide the discharge circuit, and the reset control circuit conducts the discharge path during the period when the power voltage is smaller than the threshold voltage. In this way, during an initial phase of booting the system, the residual charges accumulated at the bias node can be conducted to the ground through the discharge path. Therefore, although the power voltage is quickly switched, the start circuit can still normally provide the start voltage to the reference circuit, so that the reference circuit can normally operate.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A start circuit, using a start voltage to start a reference circuit comprising a first bias node and a second bias node, and the start circuit comprising:

a load unit, having a first end receiving a power voltage;

a first switch, having a first end electrically connected to a second end of the load unit, a second end electrically connected to a ground, and a control end receiving a node voltage from the first bias node;

a second switch, having a first end electrically connected to the second bias node, a second end electrically connected to the ground, and a control end electrically connected to the second end of the load unit, wherein the second switch determines whether or not to provide the start voltage to the second bias node according to a conducting state thereof; and a reset control circuit, for providing a discharge path between the control end of the first switch and the ground, and conducting the discharge path according to the power voltage during a period when the power voltage is smaller than a threshold voltage.

2. The start circuit as claimed in claim 1, wherein the reset control circuit comprises:

a third switch, for providing the discharge path, wherein a first end of the third switch is electrically connected to the control end of the first switch, and a second end of the third switch is electrically connected to the ground; and a controller, electrically connected to a control end of the third switch, wherein during the period when the power voltage is smaller than the threshold voltage, the controller increases a level of a reset voltage according to the power voltage to turn on the third switch, and when the power voltage is greater than the threshold voltage, the controller switches the reset voltage to a ground voltage to turn off the third switch.

3. The start circuit as claimed in claim 2, wherein the third switch is composed of a first N-channel transistor, and a drain of the first N-channel transistor is electrically connected to the control end of the first switch, a source of the first N-channel transistor is electrically connected to the ground, and a gate of the first N-channel transistor is electrically connected to the controller.

4. The start circuit as claimed in claim 1, wherein the load unit comprises:

a plurality of P-channel transistors, wherein gates of the P-channel transistors are electrically connected to the ground, and the P-channel transistors are connected in series between the power voltage and the first end of the first switch.

5. The start circuit as claimed in claim 3, wherein the first switch is composed of a second N-channel transistor, and a drain of the second N-channel transistor is electrically connected to the second end of the load unit, a source of the second N-channel transistor is electrically connected to the ground, and a gate of the second N-channel transistor is electrically connected to the first bias node.

6. The start circuit as claimed in claim 5, wherein the second switch is composed of a third N-channel transistor, and a drain of the third N-channel transistor is electrically connected to the second bias node, a source of the third N-channel transistor is electrically connected to the ground, and a gate of the third N-channel transistor is electrically connected to the second end of the load unit.

7. The start circuit as claimed in claim 1, wherein the reference circuit is a reference current generating circuit or a reference voltage generating circuit.

8. A bandgap circuit, comprising:

a reference circuit, comprising a first bias node and a second bias node; and a start circuit, using a start voltage to start the reference circuit, and comprising:

a load unit, having a first end receiving a power voltage;

a first switch, having a first end electrically connected between a second end of the load unit, a second end electrically connected to a ground, and a control end receiving a node voltage from the first bias node;

a second switch, having a first end electrically connected to the second bias node, a second end electrically connected to the ground, and a control end electrically connected to the second end of the load unit, wherein the second switch determines whether or not to provide the start voltage to the second bias node according to a conducting state thereof; and a reset control circuit, for providing a discharge path between the control end of the first switch and the ground, and conducting the discharge path according to the power voltage during a period when the power voltage is smaller than a threshold voltage.

9. The bandgap circuit as claimed in claim 8, wherein the reset control circuit comprises:

a third switch, for providing the discharge path, wherein a first end of the third switch is electrically connected to the control end of the first switch, and a second end of the third switch is electrically connected to the ground; and a controller, electrically connected to a control end of the third switch, wherein during the period when the power voltage is smaller than the threshold voltage, the controller increases a level of a reset voltage according to the power voltage to turn on the third switch, and when the power voltage is greater than the threshold voltage, the controller switches the reset voltage to a ground voltage to turn off the third switch.

10. The bandgap circuit as claimed in claim 9, wherein the third switch is composed of a first N-channel transistor, and a drain of the first N-channel transistor is electrically connected to the control end of the first switch, a source of the first N-channel transistor is electrically connected to the ground, and a gate of the first N-channel transistor is electrically connected to the controller.

11. The bandgap circuit as claimed in claim 8, wherein the load unit comprises:

a plurality of P-channel transistors, wherein gates of the P-channel transistors are electrically connected to the ground, and the P-channel transistors are connected in series between the power voltage and the first end of the first switch.

12. The bandgap circuit as claimed in claim 10, wherein the first switch is composed of a second N-channel transistor, and a drain of the second N-channel transistor is electrically connected to the second end of the load unit, a source of the second N-channel transistor is electrically connected to the ground, and a gate of the second N-channel transistor is electrically connected to the first bias node.

13. The bandgap circuit as claimed in claim 12, wherein the second switch is composed of a third N-channel transistor, and a drain of the third N-channel transistor is electrically connected to the second bias node, a source of the third N-channel transistor is electrically connected to the ground, and a gate of the third N-channel transistor is electrically connected to the second end of the load unit.

14. The bandgap circuit as claimed in claim 8, wherein the reference circuit is a reference current generating circuit or a reference voltage generating circuit.

15. The bandgap circuit as claimed in claim 8, wherein the reference circuit further comprising:

first to fourth current mirrors, wherein the first to fourth current mirrors are electrically connected in cascade, the first current mirror receives the power voltage, the fourth current mirror has the first bias node, and the second current mirror has the second bias node;

a resistor; and first and second bipolar transistors, wherein one end of the fourth current mirror is electrically connected to the ground through the resistor and the first bipolar transistor, and another end of the fourth current mirror is electrically connected to the ground through the second bipolar transistor.

* * * * *